(12) United States Patent
Lee

(10) Patent No.: US 8,151,052 B2
(45) Date of Patent: Apr. 3, 2012

(54) MEMORY CARD WITH REMOVABLE COVER

(75) Inventor: Won-Seok Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 581 days.

(21) Appl. No.: 12/314,600

(22) Filed: Dec. 12, 2008

(65) Prior Publication Data

US 2009/0164723 A1 Jun. 25, 2009

(30) Foreign Application Priority Data

Dec. 24, 2007 (KR) .................. 10-2007-0136774

(51) Int. Cl.
*G06F 12/00* (2006.01)
(52) U.S. Cl. .................... 711/115; 711/103; 711/156
(58) Field of Classification Search .................. None
See application file for complete search history.

(56) References Cited

U.S. PATENT DOCUMENTS

| 2001/0004326 A1* | 6/2001 | Terasaki | 365/185.23 |
| 2006/0264084 A1* | 11/2006 | Laitinen | 439/326 |

FOREIGN PATENT DOCUMENTS

| KR | 10-2000-0036382 | 7/2000 |
| KR | 10-0354463 | 9/2002 |
| KR | 10-2005-0028630 | 3/2005 |

* cited by examiner

*Primary Examiner* — Shawn X Gu
(74) *Attorney, Agent, or Firm* — Harness, Dickey & Pierce

(57) ABSTRACT

The memory card includes a memory controller covered by a main body, a first non-volatile memory, a memory interface configured to transfer a signal between the memory controller and the first non-volatile memory, and a cover coupled to the main body and removeably covering the first memory and the memory interface. Here, the memory interface includes a connection detector configured to generate a connection detector signal when sensing that a package including a second non-volatile memory is added.

14 Claims, 9 Drawing Sheets

MEMORY CARD WITH REMOVABLE COVER

CROSS-REFERENCE TO RELATED APPLICATION

This application claims the benefit of Korean Patent Application No. 10-2007-0136774, filed Dec. 24, 2007, the contents of which are hereby incorporated herein by reference in their entirety.

BACKGROUND

1. Field

Example embodiments relate to a memory card, and more particularly, to a memory card whose storage capacity can be readily increased by a user.

2. Description of Related Art

In digital products or digital peripheral devices such as Personal Computers (PCs), Motion Picture Experts Group (MPEG) audio layer-3 (MP3) players, digital cameras and electronic dictionaries, a memory storage device may be frequently used to store and replay data. In general, a memory card may be used as a portable memory storage device, and there are various memory cards such as memory sticks, Secure Digital (SD) cards, mini SD cards and Multimedia Cards (MMCs).

FIG. 1 is a cross-sectional view of a general memory card. Referring to FIG. 1, a memory card 100 may include a memory controller 120 and a non-volatile memory 130 in a resin molding 140 to receive and store data from a host (not shown) through a connector 110 or to output data stored in the memory card 100 to the host.

As the demand for large data storage, a host needs a memory card having higher storage capacity However, since the capacity of a non-volatile memory included in the memory card may be fixed when it is produced, and a user cannot change the non-volatile memory in a resin molding of the memory card, the capacity of a memory card cannot be increased. Therefore, the user has to purchase another expensive high-capacity memory card.

SUMMARY

According to example embodiments, a memory card includes a memory controller covered by a main body, a first memory, a memory interface connecting the memory controller to the first memory, and a cover coupled to the main body and removeably covering the first memory and the memory interface. Here, the memory interface may further interface a memory interface signal between the memory controller and a package having second memory.

The memory interface includes a connection detector configured to generate a connection detector signal when sensing that the second memory is connected to the memory interface. The memory interface further includes interface pads receiving corresponding memory interface signals. Here, the interface pads are disposed around at least one side of the first memory.

The main body includes a first portion covering the memory controller and a second portion surrounding three sides of the first memory. Here, a first end of the cover connects to the first portion by a connection ring and a second end of the cover removeably combines to the second portion. Also, the second end of the cover may include an insertion pin and the second portion may include a groove, so that the insertion pin is inserted into the groove. The cover may include a shock-absorbing mechanism disposed above the first memory when the insertion pin is inserted into the groove. The first memory includes a register for storing identification information. The memory interface signal may include a signal indicating the identification information.

According to example embodiments, the memory card includes a memory controller covered by a main body, a first non-volatile memory, a memory interface connecting to the memory controller to the first non-volatile memory, a package including a second non-volatile memory connected to the memory interface over the first non-volatile memory, and a cover coupled to the main body removeably covering the package. Here, the memory interface includes interface pads and a connection detector, and the package includes a plurality of pads so that each of the plurality of the pads is connected to corresponding interface pads of the memory interface. Also, the plurality of the pads includes a connection pad connected to the connection detector.

According to example embodiments, an operating method of a memory card includes detecting whether a first memory and a second memory are installed in the memory card, sending installation information to a host, and setting identification information into the first and the second non-volatile memories according to the installation information. The operating method of a memory card further includes receiving a host interface signal including the identification information at the memory card, converting the host interface signal into a memory interface signal including the identification information, transferring the memory interface signal to the first and the second non-volatile memories, comparing the stored identification information and the transferred identification information in each memory, and writing and/or reading data into/from one of the memories in response to the result of comparing. Also the operating method of a memory card may further include erasing stored data in one of the memories or both of the memories.

Other details of the example embodiments are set forth in the following detailed description and the accompanying drawings.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
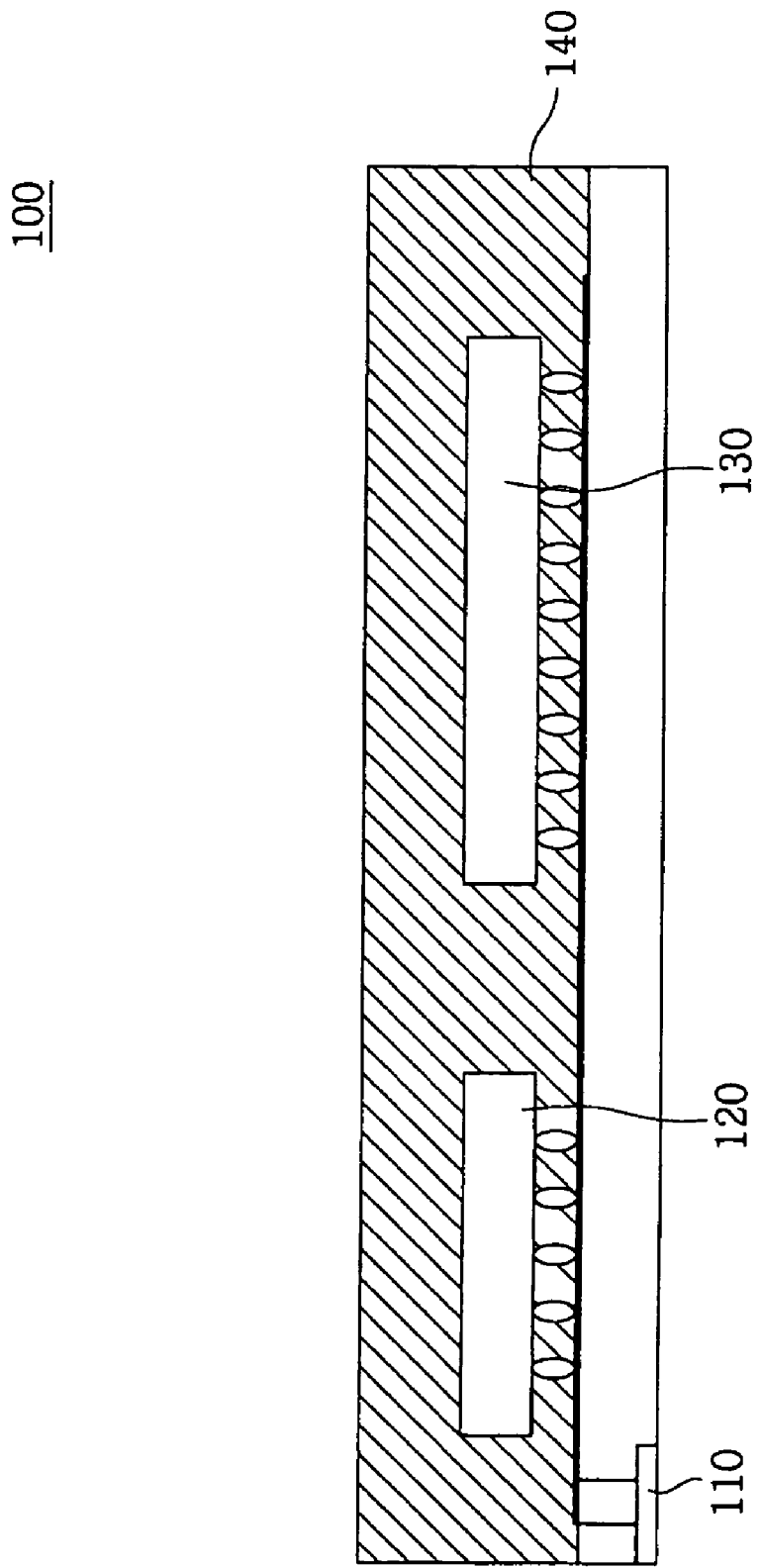
FIG. 1 is a cross-sectional view of a general memory card.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In this specification, the term "and/or" picks out each individual item as well as all combinations of them.

Terms used in this specification are intended not to limit the example embodiments but to describe example embodiments. Terms written in the singular are to be interpreted as possibly being plural unless stated otherwise. In addition, the terms "comprise" and/or "comprising" do not exclude the existence or addition of at least one component, step and/or device other than those mentioned.

A memory card according to example embodiments will be described in detail below with reference to the accompanying drawings.

Figure 2:
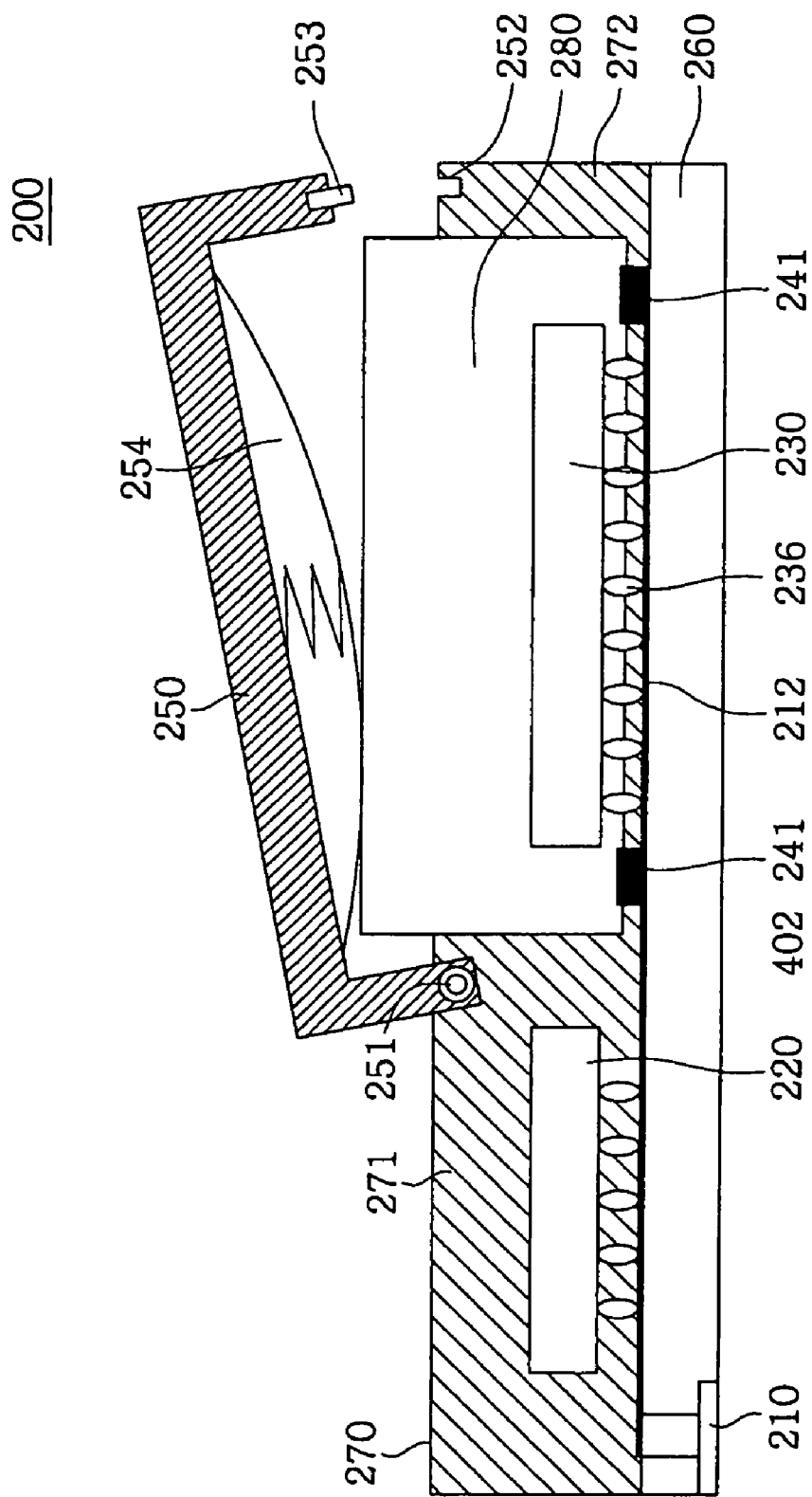
FIG. 2 is a cross-sectional view of a memory card according to example embodiments.
Figure 3:
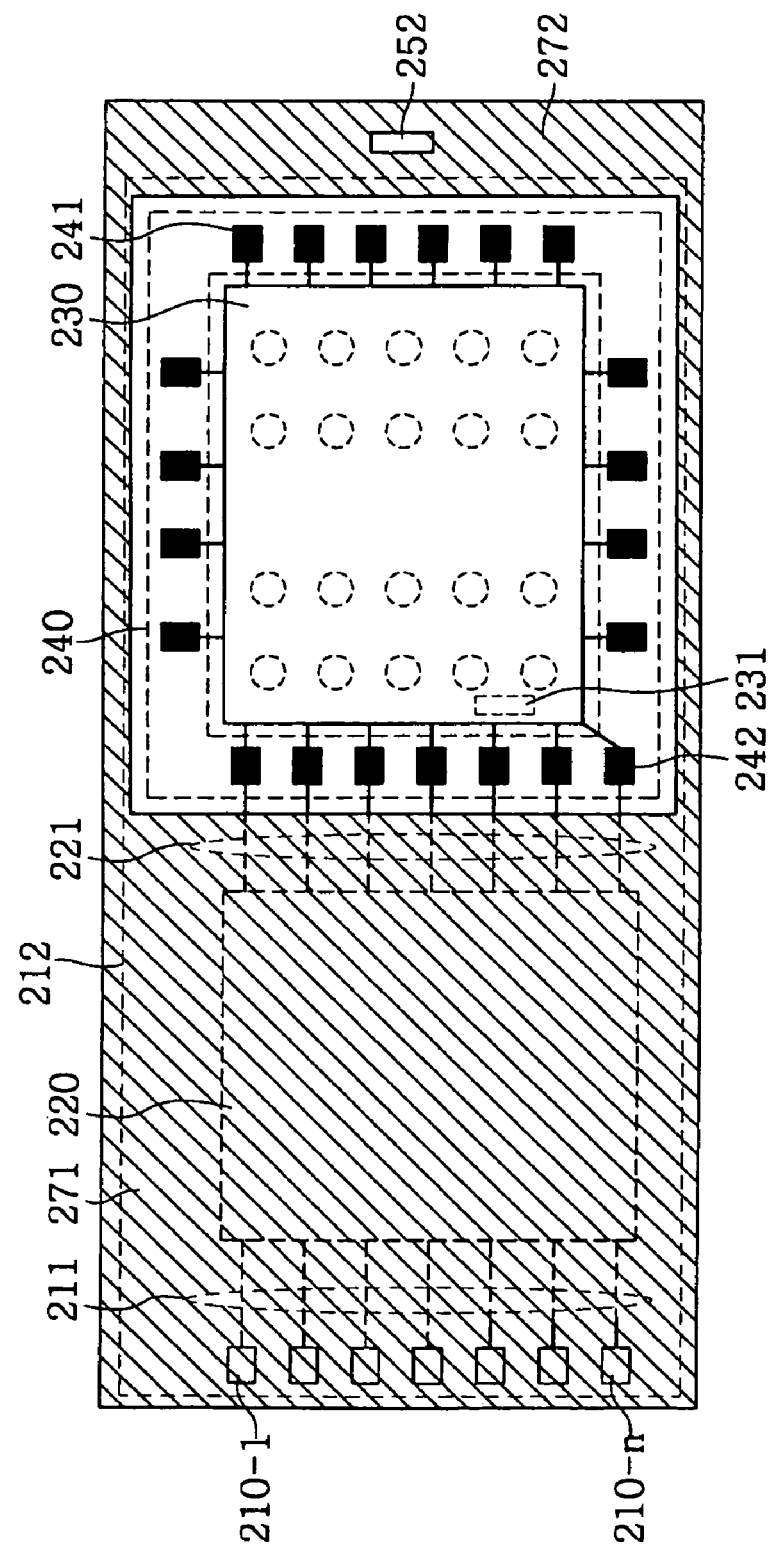
FIG. 3 is a plan view of the memory card of FIG. 2.

FIGS. 2 and 3 are a cross-sectional view and a plan view of a memory card 200 according to example embodiments, respectively. The memory card 200 according to example embodiments may include a host connector 210, a memory controller 220, a non-volatile memory 230, a memory interface 240, a cover 250, a printed circuit board 260 and a main body 270. FIG. 3 is a plan view of the memory card 200 of FIG. 2 of which the cover 250 is not installed.

The constitution of the memory card 200 according to example embodiments will be described below with reference to FIGS. 2 and 3.

The host connector 210 may include a plurality of Input/Output (I/O) pins 210-1 to 210-$n$ in one surface of the memory card 200. The I/O pins 210-1 to 210-$n$ may interface a host interface signal including power, a clock signal, control signals, data, etc., required for operation of the memory card 200, with a host. The number of the I/O pins 210-1 to 210-$n$ may vary according to the memory card. For example, a Secure Digital (SD) card may include one clock pin, three power pins, four data pins, and one command pin.

The memory controller 220 may be connected with the host connector 210 through host signal lines 211 formed in the Printed Circuit Board (PCB) 260. The memory controller 220 may receive the host interface signal, convert the host interface signal into a memory interface signal, and transfer the memory interface signal to the non-volatile memory 230 through memory signal lines 221. In addition, the memory controller 220 may receive read data from the non-volatile memory 230 through the memory signal lines 221 and transfer the read data to the host through the host signal lines 211 and the host connector 210.

The memory interface signal may be required for operation of the non-volatile memory 230, and include a control signal, data, etc., required for writing or reading data in/from non-volatile memory cells (not shown). The control signal may include Identification (ID) information for selecting the corresponding one of a plurality of non-volatile memories.

The non-volatile memory 230 may be controlled by the memory controller 220 through the memory signal lines 221 to store or read data. The non-volatile memory 230 may be one of a flash memory, a phase change memory, a resistive memory and a magnetic memory. Also, the non-volatile memory 230 may include a register 231 for storing the identification information. FIG. 3 shows, as an example, a chip-scale package in which the non-volatile memory 230 is connected with the PCB 260 through a plurality of balls 236, but the example embodiments are not limited thereto.

The memory interface 240 may include a interface pads 241 respectively connected with the memory signal lines 221, and may be disposed between the memory controller 220 and the non-volatile memory 230. In FIGS. 2 and 3, the interface pads 241 are shown disposed around all the four sides of the non-volatile memory 230, but may be disposed around only one, two or three sides. The interface pads may include at least one connection detector 242 for sensing when additional non-volatile memory is connected. The connection detector 242 may include a connection detector signal generator (not shown) that may sense the connection of the additional non-volatile memory and generate a connection detector signal. In addition, the connection detector 242 may transfer the connection detector signal to either the memory controller 220 or the non-volatile memory 230. In the example embodiments, the connection detector 242 may be included in the memory interface 240, but the connection detector signal generator of the connection detector 242 may be disposed somewhere other than the memory interface 240. For example, the connection detector may be disposed in the memory controller 220.

In addition, FIG. 3 shows the interface pads 241 and the memory signal lines 221 formed in the main body 270, but the example embodiments are not limited thereto.

The main body 270 may be formed over the memory controller 220 and around the non-volatile memory 230 on the PCB 260. A first portion 271 of the main body 270 covers the host interface 210 and the memory controller 220. A side wall 271-1 of the first portion 271 and a second portion 272 of the main body 270 define a space 280 including the non-volatile memory 230 and the memory interface 240. As shown in FIG. 2, the second portion 272 of the main body 270 surrounds three sides of the non-volatile memory 230. The main body 270 may be formed of a resin.

The cover 250 covers the non-volatile memory 230 and the memory interface 240. One side of the cover 250 may be connected with the first portion 271 by a connection ring 251 such that a user can manually open and close the cover 250, and the other side of the cover 250 may include an insertion pin 253 to be inserted into a groove 252 in the second portion 272. In addition, the lower part of the cover 250 may include a shock-absorbing mechanism 254 including a spring disposed above the non-volatile memory 230 when the insertion pin 253 is inserted into the groove 252.

Figure 4A:
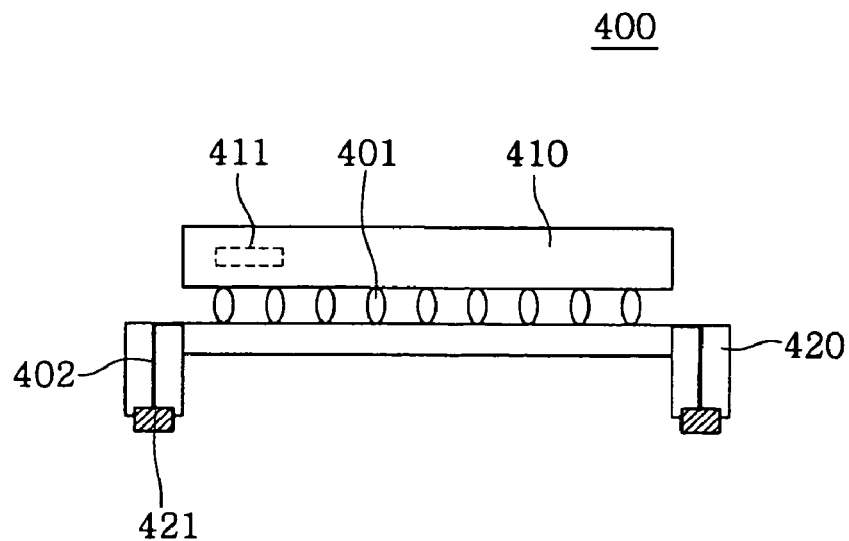
FIGS. 4A to 4C illustrate a package including a non-volatile memory additionally installed in the memory card of FIG. 2.
Figure 4B:
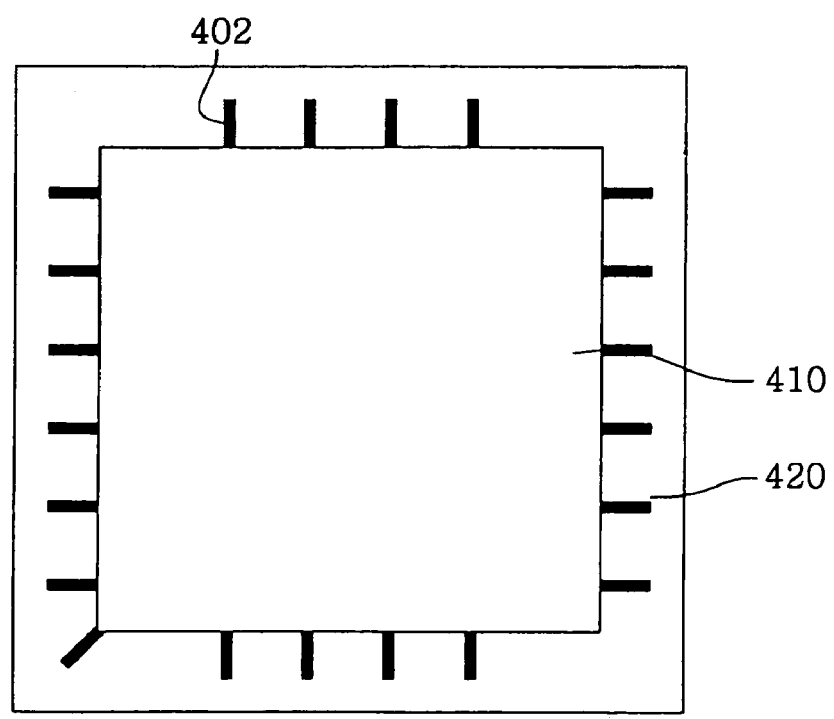
Figure 4C:
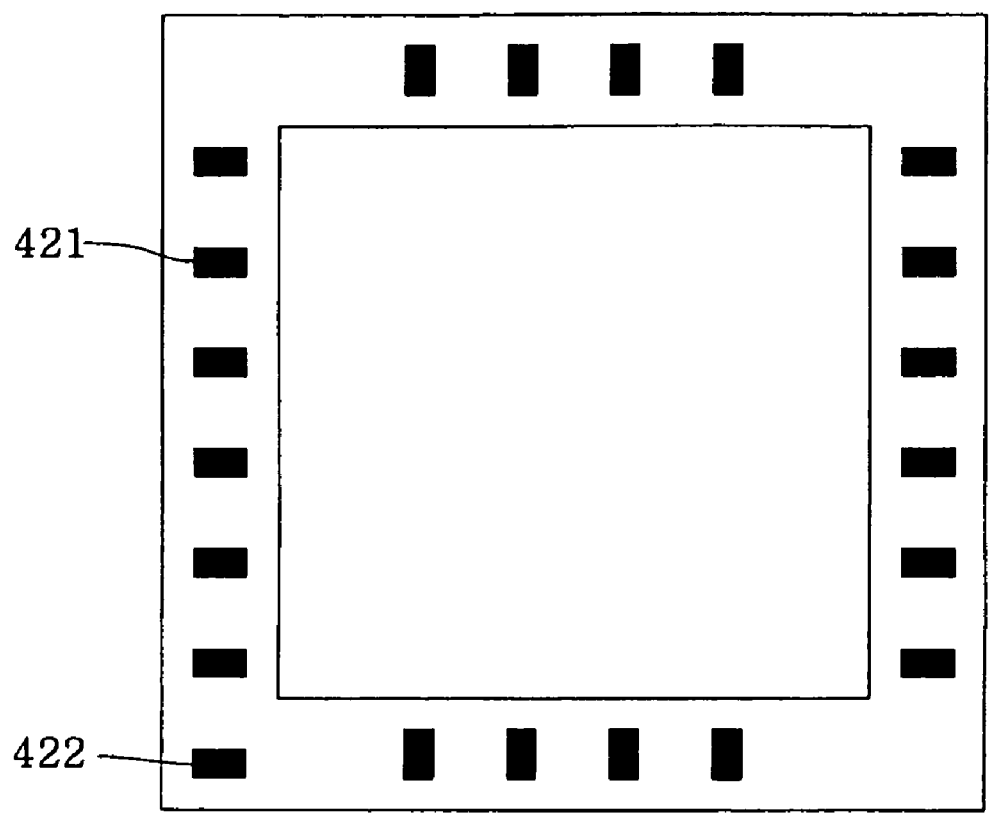

FIGS. 4A to 4C illustrate a package including a non-volatile memory for additional installation in the memory card of FIG. 2. FIGS. 4A to 4C are a cross-sectional view, a plan view and a bottom view of the package, respectively.

Referring to FIGS. 4A to 4C, the package 400 may include a non-volatile memory 410 connected with a plurality of balls 401 to a circuit board 420 in the form of a chip scale package. The circuit board 420 has signal lines respectively connected with the balls 401. A plurality of pads 421 are connected with the signal lines 402 respectively and formed on the ends of the circuit board 420. In addition, the package 400 may further include a connection 422 in the circuit board 420 which corresponds to the connection detector 242 of the memory interface 240 of FIG. 3. When the package 400 is installed in the memory card of FIG. 3, the connection detector pad 242 may be connected to the connection pad 422. Also, the non-volatile memory 410 may include a register 411 to store identification information.

Figure 5:
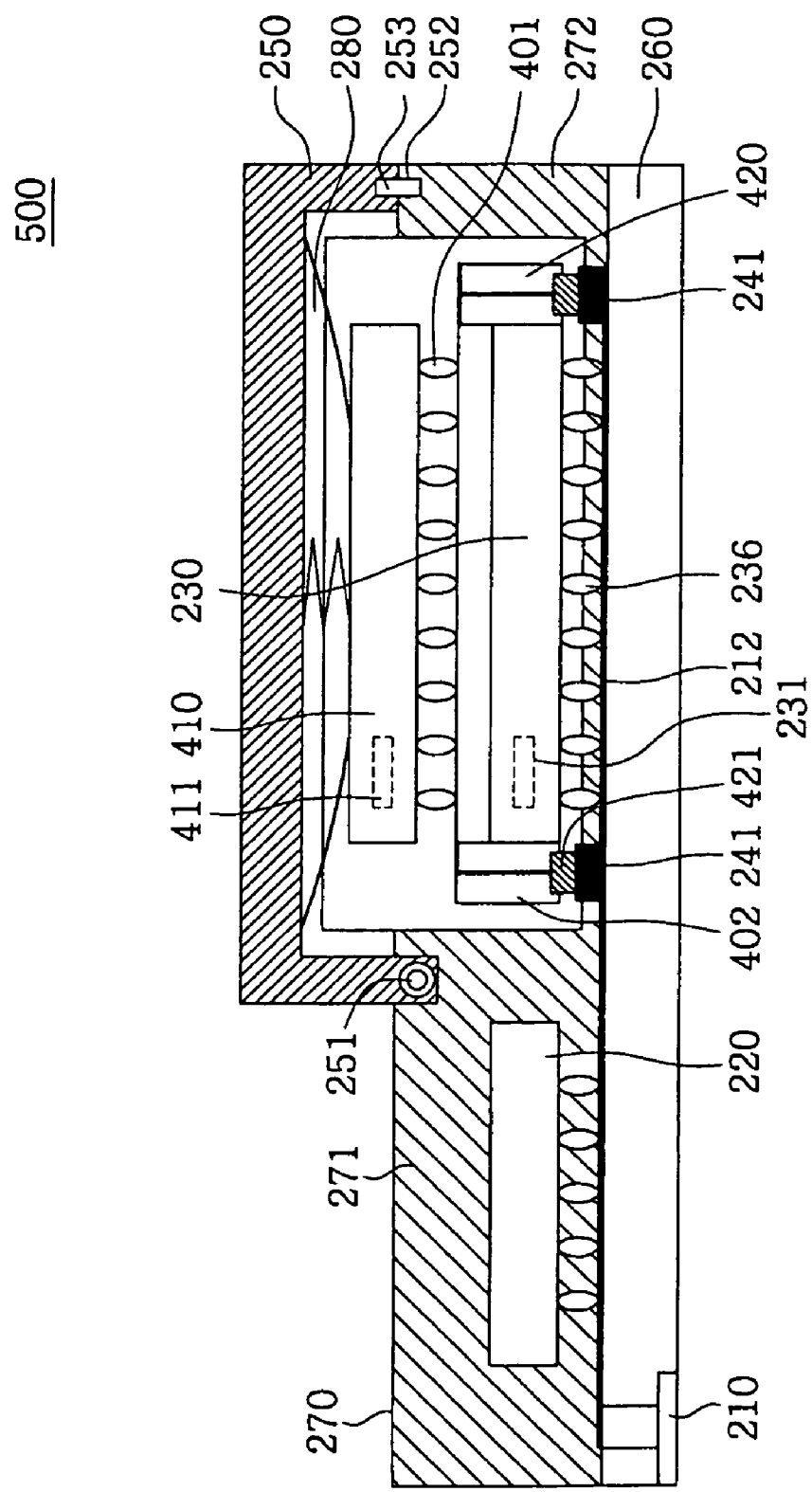
FIG. 5 is a cross-sectional view of the memory card of FIG. 2 in which two non-volatile memories are installed.
Figure 6:
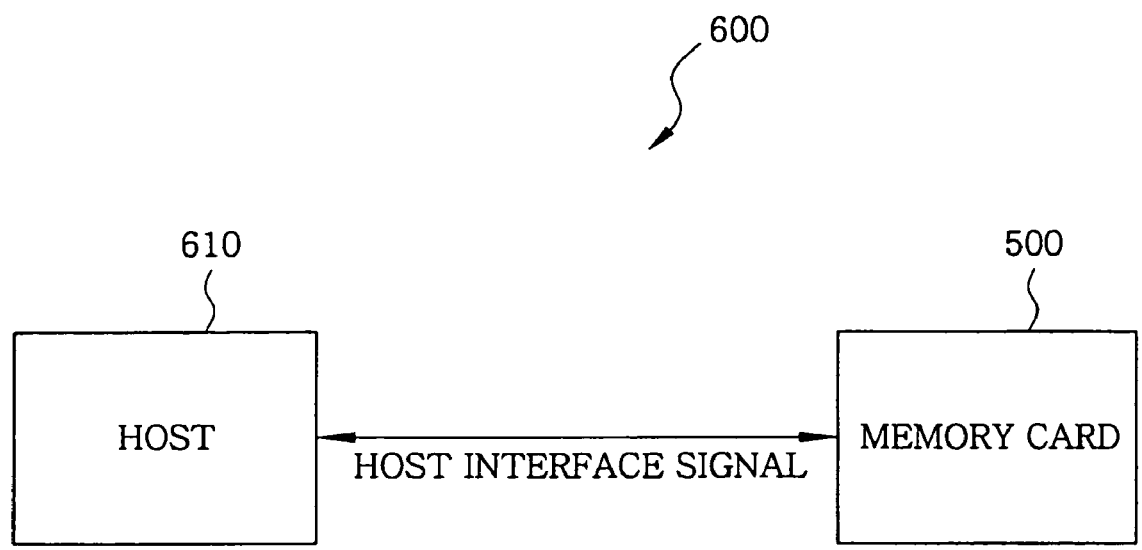
FIG. 6 illustrates a memory card system according to an embodiment of the present invention.

FIG. 5 is a cross-sectional view of the memory card of FIG. 2 in which two non-volatile memories are installed. FIG. 6 is a memory card system including a host and a memory card of FIG. 5.

Referring to FIG. 5, the memory card 500 may include first and second non-volatile memories 230 and 410 to increase storage capacity. As shown, when the cover 250 is closed, the shock-absorbing mechanism 254 of the cover 250 may press non-volatile memory 410 such that pads 421 become respectively connected with the corresponding interface pads 241 of the memory interface 240, and the insertion pin 253 is inserted into a groove 252 formed in the second portion 272.

Referring to FIG. 6, the memory card system 600 may include a host 610 and the memory card 500. The host 610 and the memory card 500 interface a host signal each other.

An embodiment of an operating method of the memory card 500 of FIG. 5 whose storage capacity is increased will be described below with reference to FIG. 6.

A host 610 may detect whether the memory card 500 has one or more non-volatile memories. When the pads 421 of the package 400 including the second non-volatile memory 410 are connected with the interface pads 241 of the memory interface 240, the connection pad 422 may be connected to the connection detector 242. The connection detector generates the connection detector signal. The memory controller 220 may recognize that two non-volatile memories are installed in response to the connection detector signal and send the installation information to the host. Also, in response to the connection detector signal, each of the first and second non-volatile memories 230 and 410 may have a value set into the ID registers 231, 411 respectively. For example, when the initial value of each ID register is "0", the ID register 231 of first non-volatile memory 230 may maintain "0" in response to the connection detector signal, and the ID register 411 of the second non-volatile memory 410 may change the initial value into "1" in response to the connection detector signal. This ID setting operation may be executed during a power up sequence.

The host sends the host interface signal to the memory card 500 including identification (ID) information for selecting the corresponding one of the two non-volatile memories 230 and 410. The memory controller 220 may convert the host interface signal into a memory interface signal including the ID information and transfer the memory interface signal to the non-volatile memories 230 and 410 through the memory interface 240 at the same time.

Each of the non-volatile memories 230 and 410 may compare the ID information included in the memory interface signal with the value stored in the ID register. A non-volatile memory whose value stored in the ID register is the same as the ID information may write data into non-volatile memory cells (not shown) in response to the memory interface signal, or output data stored in the non-volatile memory cells to the memory controller 220. On the other hand, a non-volatile memory whose value stored in the ID register is not the same as the ID information may not perform any operation. When the host interface signal includes an erase operation for two non-volatile memories, the comparing sequence may be not ignored in order to erase stored data in the two non-volatile memories at a same time. It may also be possible to erase stored data in each non-volatile memory separately if the comparing sequence is not ignored.

It has been described that only two non-volatile memories are installed in the memory card of FIGS. 2 and 5, but those skilled in the art can easily connect three or more memory cards to increase storage capacity without departing form the spirit of the example embodiments.

Figure 7:
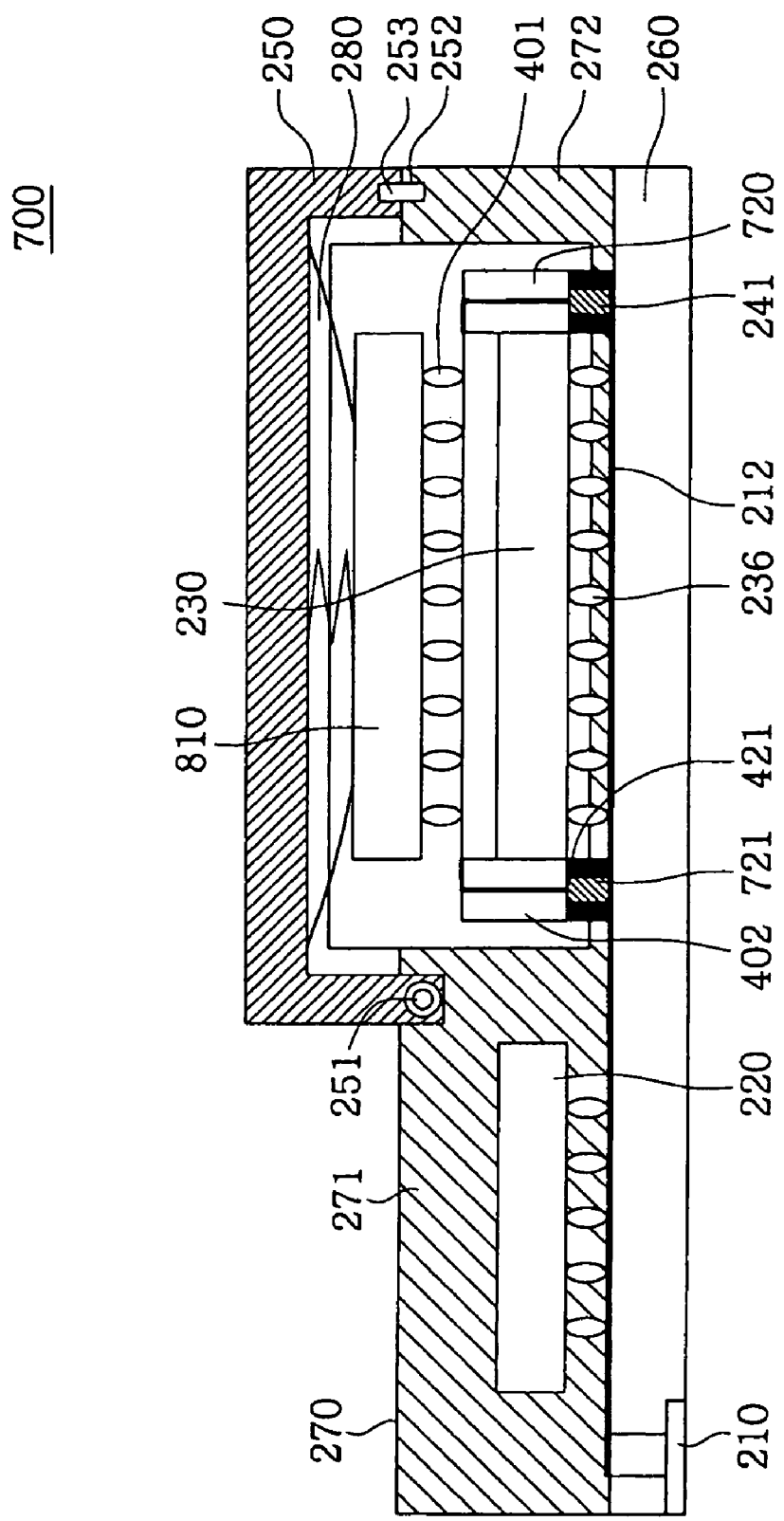
FIG. 7 is a cross-sectional view of a memory card in which two non-volatile memories are installed according to other example embodiments.
Figure 8:
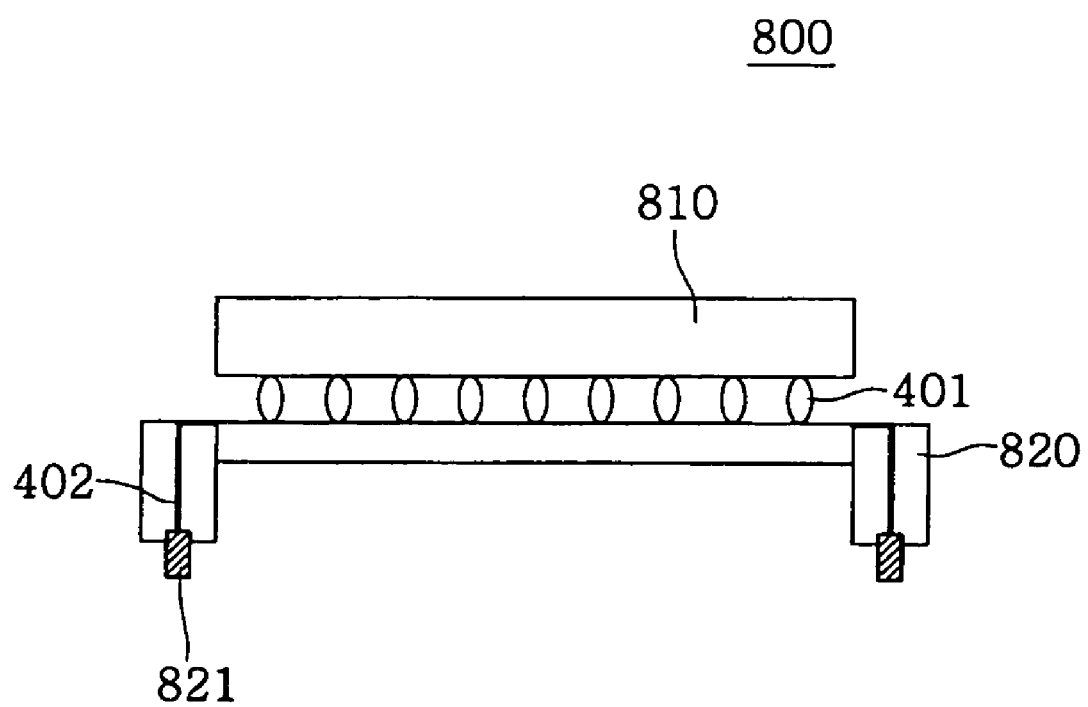
FIG. 8 illustrates a package including a non-volatile memory additionally installed in the memory card of FIG. 6.

FIG. 7 is a cross-sectional view of a memory card in which two non-volatile memories are installed according to other example embodiments. FIG. 8 illustrates a package including a non-volatile memory for additional installation in the memory card of FIG. 7. The same reference numerals will be used below to denote the same components as in the first example embodiment of FIGS. 2 and 5, and the description below focuses on constitutional differences between the two example embodiments for the sake of brevity.

Referring to FIGS. 7 and 8, the memory card 700 may be the same as that of FIG. 5 except that the connection of between the interface pads 241 of the memory interface 240 and the pads 821 of package 800 is embodied by insertion mechanism. The pads 821 of package 800 may have a pin shape, and the interface pads 241 in which the corresponding pads 821 is inserted may be formed on the PCB 260 of the memory card 700. Thus the package 800 may be installed more firmly in the memory card 700.

Operation of the memory card 600 of FIG. 7 is the same as that of the memory card 200 of FIG. 5 and thus will not be described again.

As described above, a user may add a non-volatile memory to a memory card and does not need to purchase an expensive high-capacity memory card. Operation and effects of the expanded memory card are the same as those of the memory cards of FIG. 3 and FIG. 5, and thus the detailed description thereof will be omitted.

In a memory card according to example embodiments, a user can add a non-volatile memory to a memory card to increase storage capacity and thus does not need to purchase an expensive high-capacity memory card While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A memory card, comprising:
   a memory controller covered by a main body;
   a first memory; and
   a memory interface connecting the memory controller to the first memory; and
   a cover coupled to the main body and removably covering the first memory and the memory interface.

2. The memory card of claim 1, further comprising:
   a package having a second memory; and wherein
   the memory interface interfaces the memory controller and the package having the second memory.

3. The memory card of claim 1, wherein the memory interface includes a connection detector configured to generate a connection detector signal if a second memory is connected to the memory interface.

4. The memory card of claim 3, wherein the memory interface further includes interface pads receiving corresponding memory interface signals.

5. The memory card of claim 4, wherein the interface pads are disposed around at least one side of the first memory.

6. The memory card of claim 5, wherein the main body comprises:
   a first portion covering the memory controller; and
   a second portion surrounding three sides of the first memory; and wherein
   a first end of the cover connects to the first portion by a connection ring and
   a second end of the cover removably combines to the second portion.

7. The memory card of claim 6, wherein the second end of the cover includes an insertion pin and the second portion includes a groove, so that the insertion pin is removably inserted into the groove.

8. The memory card of claim 7, wherein the cover includes a shock-absorbing mechanism disposed above the first memory when the insertion pin is inserted into the groove.

9. The memory card of claim 1, wherein the first memory includes a register for storing identification information.

10. The memory card of claim 9, wherein the memory interface is configured to supply a memory interface signal to the first memory that includes the identification information.

11. The memory card of claim 10, further comprising:
    a connection detector detecting connection of the first memory; and wherein
    the identification information is received in response to a connection detector signal from the connection detector.

12. A memory card, comprising;
    a memory controller covered by a main body;
    a first non-volatile memory interfacing a memory interface signal with the memory controller; and
    a memory interface connecting to the memory controller and to the first non-volatile memory;
    a package including a second non-volatile memory connected to the memory interface over the first non-volatile memory; and
    a cover coupled to the main body removably covering the package.

13. The memory card of claim 12, wherein
    the memory interface includes interface pads and a connection detector; and
    the package includes a plurality of pads so that each of the plurality of the pads is connected to a corresponding one of the interface pads of the memory interface.

14. The memory card of claim 13, wherein the plurality of the pads includes a connection pad connected to the connection detector.

* * * * *